(12) United States Patent  
Khunpukdee et al.

(10) Patent No.: US 8,884,415 B2  
(45) Date of Patent: Nov. 11, 2014

(54) IC PACKAGE WITH STAINLESS STEEL LEADFRAME

(71) Applicant: NXP B.V., Eindhoven (NL)

(72) Inventors: Peeradech Khunpukdee, Bangkok (TH); Bodin Kasemset, Bangkok (TH); Ernst Eiper, Graz (AT); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/779,889

(22) Filed: Feb. 28, 2013

(65) Prior Publication Data

US 2014/0239471 A1    Aug. 28, 2014

(51) Int. Cl.
*H01L 23/495* (2006.01)
*H01L 21/768* (2006.01)

(52) U.S. Cl.
CPC ........ *H01L 23/495* (2013.01); *H01L 21/76838* (2013.01)
USPC ......................................................... 257/676

(58) Field of Classification Search
CPC .................................................... G06Q 20/341
USPC .......... 235/380, 492; 257/E23.054, 676, 666, 257/679
See application file for complete search history.

(56) References Cited

U.S. PATENT DOCUMENTS

| 4,727,246 A * | 2/1988 | Hara et al. ..................... 235/488 |
| 2002/0060903 A1* | 5/2002 | Kano et al. ..................... 361/727 |
| 2011/0224073 A1* | 9/2011 | Owashi et al. ................ 503/200 |

* cited by examiner

Primary Examiner — Whitney T Moore

(57) ABSTRACT

Various aspects of the disclosure are directed to integrated circuit (IC) die leadframe packages. In accordance with one or more embodiments, a stainless steel leadframe apparatus has a polymer-based layer that adheres to both stainless steel and IC die encapsulation, with the stainless steel conducting signals/data between respective surfaces for communicating with the packaged IC die. In some embodiments, the apparatus includes the IC die adhered to the polymer-based layer via an adhesive, wire bonds coupled to the stainless steel leadframe for passing the signals/data, and an encapsulation epoxy that encapsulates the IC die and wire bonds.

20 Claims, 8 Drawing Sheets

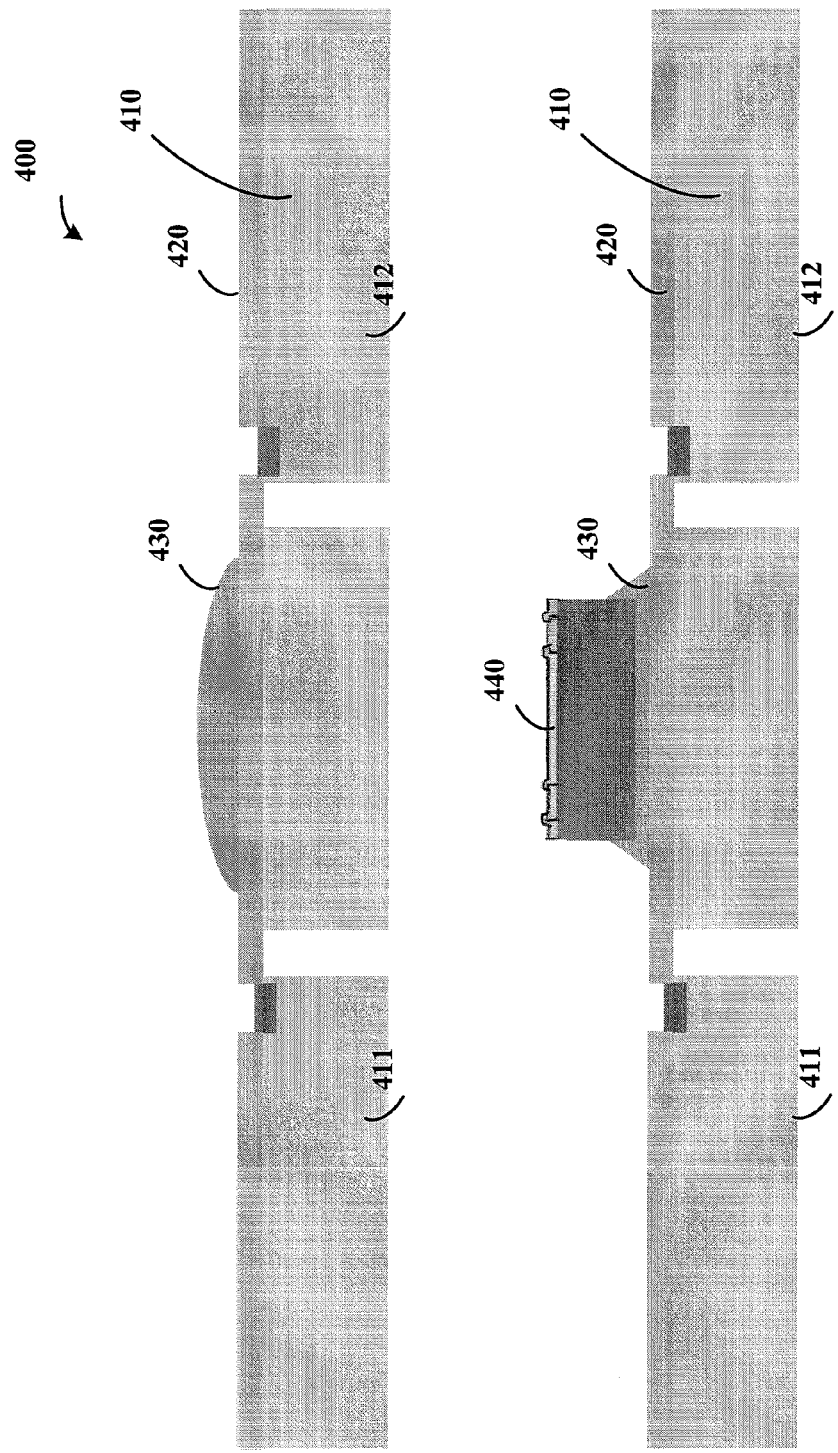

IC PACKAGE WITH STAINLESS STEEL LEADFRAME

Aspects of various embodiments are directed to integrated circuit (IC) packages, and to IC packages with a stainless steel leadframe, such as packages for smartcard applications.

Many IC packages such as smartcard packages employ a leadframe to which an IC die is attached via an encapsulation material, and in which the IC die is electrically coupled to the leadframe via one or more connections. Connection to the IC die can then be made via connections through the leadframe.

For many applications, such as those involving smartcards with embedded IC packages, the thickness of the package can be important. For example, it can be desirable to have a relatively thin package when embedding the package into a smartcard. In addition to desirably small thickness, IC packages used in smartcards can benefit from strength and flexibility, resistance to abrasion and good electrical contact characteristics.

While a variety of IC packages have been useful for many different applications, it has remained challenging to implement IC packages at desirable thicknesses while also attaining strength, conductivity and other characteristics needed for implementation. These and other matters have presented challenges to the implementation of IC packages including leadframes, for a variety of applications.

Various example embodiments are directed to IC packages and their implementation.

According to an example embodiment, an apparatus includes an integrated circuit (IC) die having first and second contacts that is coupled to a stainless steel leadframe, which has first and second portions separated by at least one opening having sidewalls defined by the leadframe. A first material is on and adheres to a first surface of the stainless steel leadframe, and a second material adheres the IC die to the first material by adhering to both the IC die and the first material. First and second conductors are respectively connected between the first and second contacts, and first and second portions of the leadframe (via openings in the first material), in which the portions of the leadframe are electrically isolated by one or more openings therein. The conductors operate to pass signals between the contacts and the respective portions of the leadframe to which they are connected. A third material encapsulates at least a portion or all of the IC die, with the first and third material adhereing to one another and secure the IC die relative to the leadframe.

In some embodiments, the first material includes a polymer that adheres to the stainless steel in the leadframe, the second material, the third material, and a fourth adhesive material that adheres the leadframe to a smartcard having a recessed region. The recessed region accepts and adheres to the IC die and leadframe package via adhesion between the fourth adhesive material and the first material, and provides contact via a surface of the leadframe (e.g., coplanar with the smartcard).

Another embodiment is directed to a method as follows. First and second portions of a stainless steel leadframe are separated and electrically isolated by forming at least one opening in the leadframe, the opening having sidewalls defined by the leadframe. A first material is formed on a first surface of the stainless steel leadframe, and adheres to the leadframe. An IC die having first and second contacts is adhered to the first material by forming a second material on the first material and using the second material to adhere to both the first material and the IC die. A first conductor is connected between the first contact and the first portion of the leadframe via a first opening in the first material, providing an electrical connection that passes a signal between the first contact and the first portion of the leadframe. A second conductor is connected between the second contact and the second portion of the leadframe, via a second opening in the first material, providing an electrical connection that passes a signal between the second contact and the second portion of the leadframe. At least a portion of the IC die is encapsulated with a third material, and the first and third materials are used to adhere to one another and secure the IC die relative to the leadframe.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which:

FIGS. 3A-3E show a leadframe apparatus at various stages of manufacture in accordance with one or more embodiments, in which:

FIG. 3A shows a stainless steel leadframe base,

FIG. 3B shows the leadframe with openings punched therein,

Figure 3A:
Figure 3B:
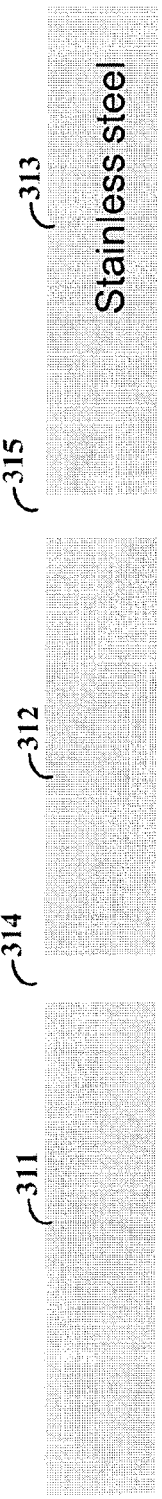
Figure 3B:
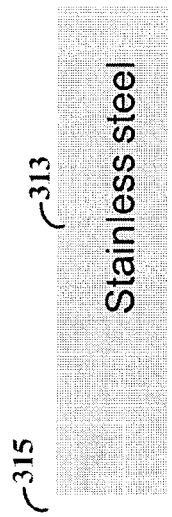
Figure 3C:
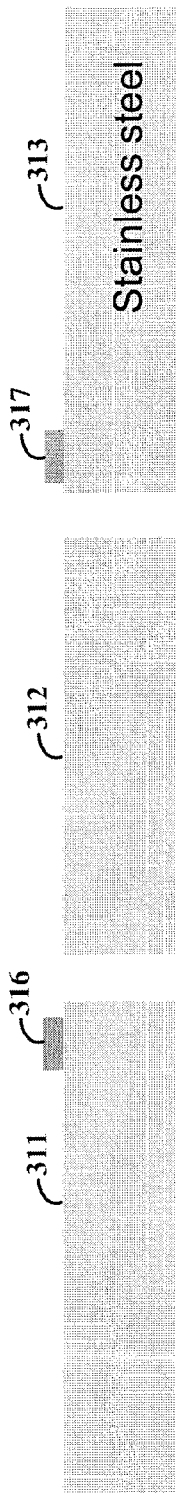
Figure 3C:
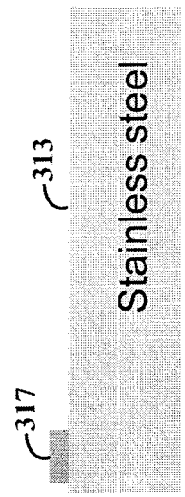
Figure 3D:
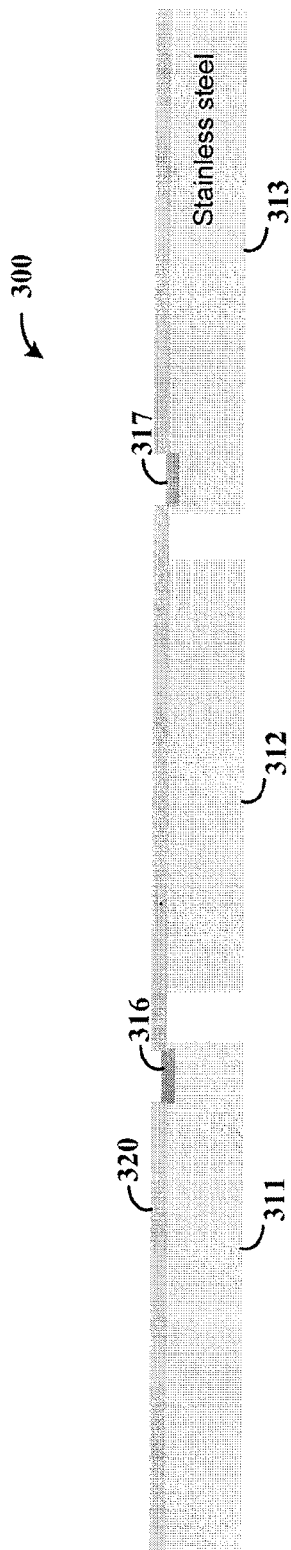
Figure 3E:
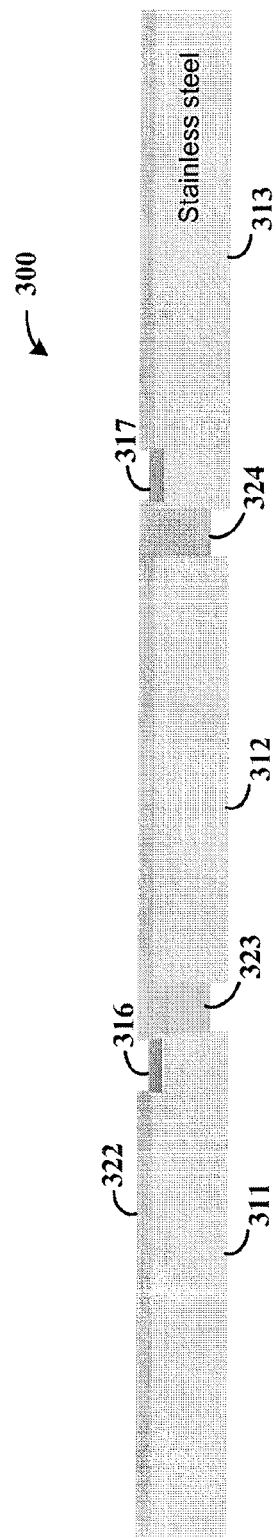
Figure 4C:
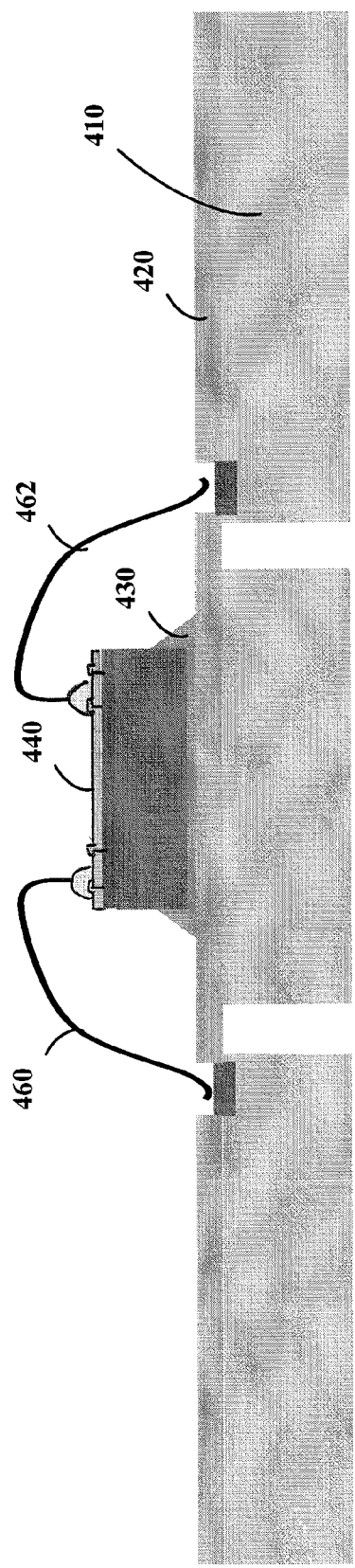
Figure 4D:
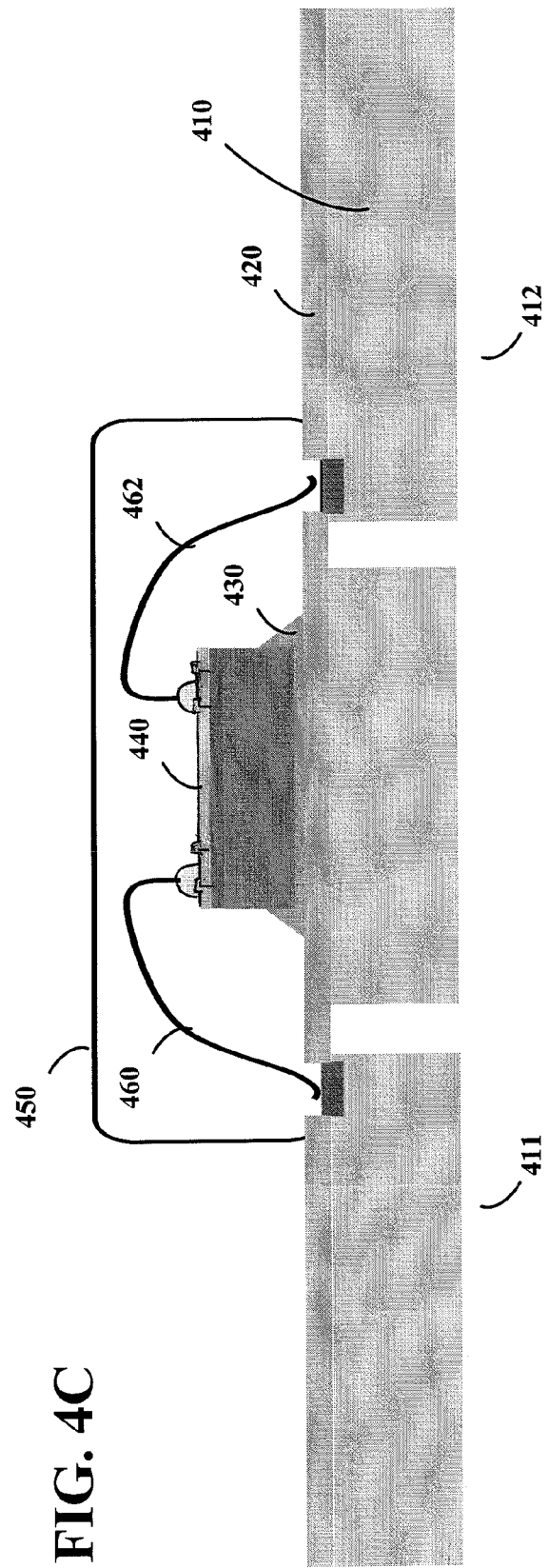
Figure 5:
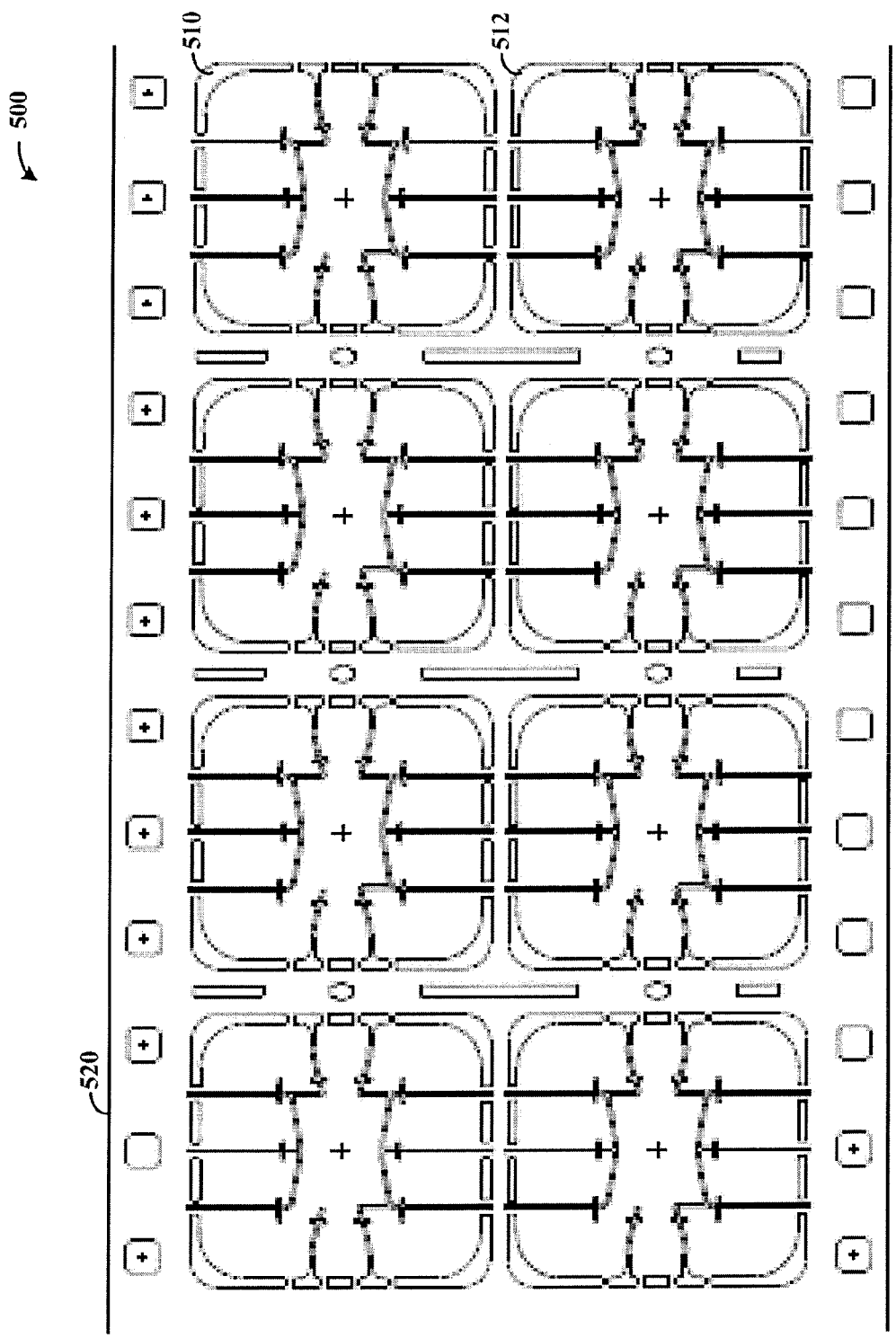
Figure 6:
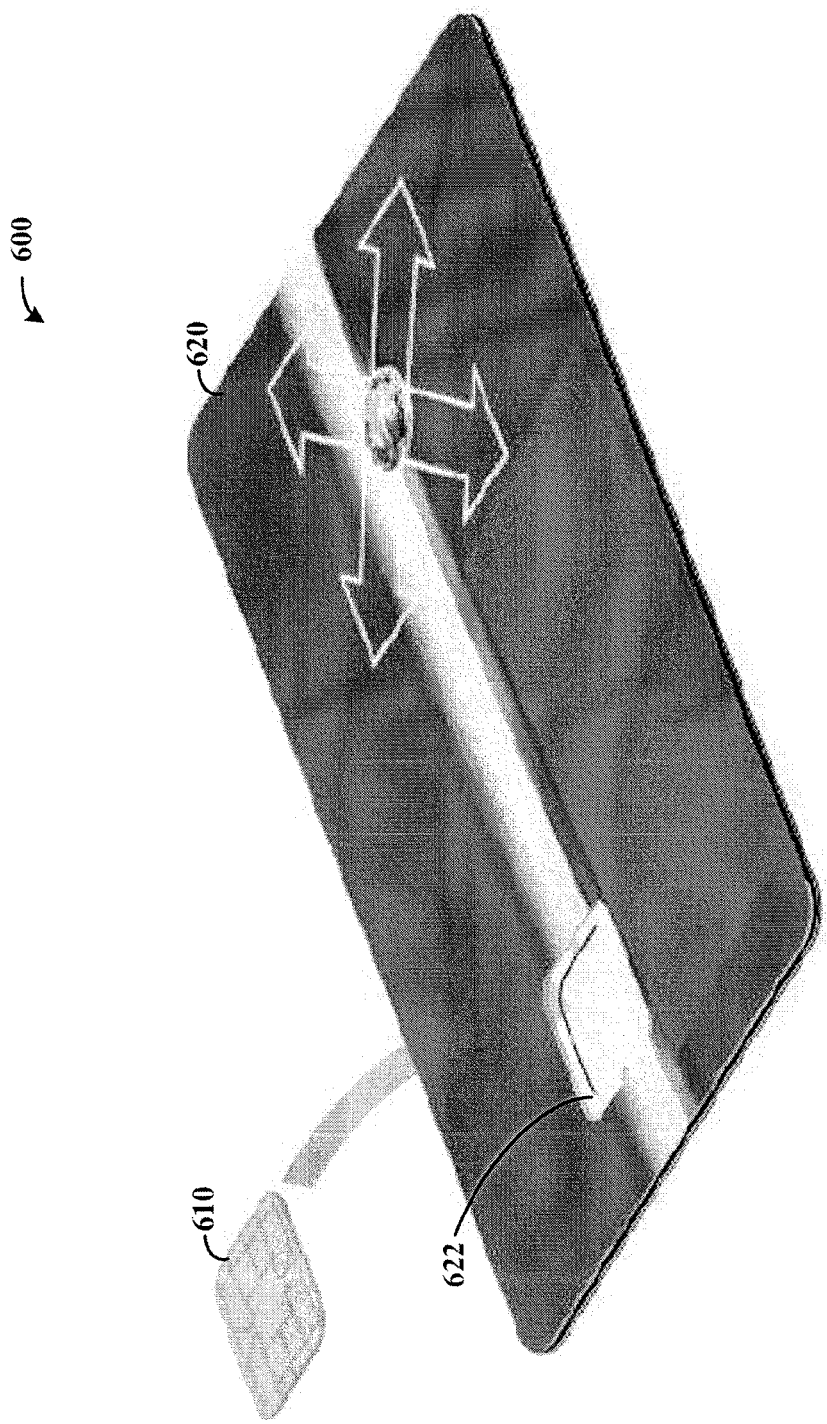

FIG. 3C shows the apparatus with the leadframe having plated contacts thereupon, FIG. 3D shows a first implementation in which the apparatus has a polymer-based coating that adheres to the leadframe and package encapsulation material, as may be implemented in accordance with one or more embodiments, and FIG. 3E shows a second implementation in which the apparatus has a polymer-based coating that adheres to the leadframe and package encapsulation material and fills a portion of openings in the leadframe, as may be implemented in accordance with one or more embodiments;

FIGS. 4A-4D show an IC package apparatus at various stages of manufacture, in accordance with one or more embodiments, in which:

FIG. 4A shows a leadframe, such as shown in FIG. 3D, with an adhesive material on a polymer-based coating, FIG. 4B shows the leadframe with an IC die adhered to the adhesive material, FIG. 4C shows the IC die having wire-bond connections with the leadframe, and FIG. 4D shows the IC package with the IC die encapsulated, and the polymer-based coating adhered to both the leadframe and the encapsulation;

FIG. 5 shows a plurality of IC package apparatuses at a stage of reel-to-reel manufacture, in accordance with another example embodiment; and FIG. 6 shows a smartcard apparatus having an IC package, in accordance with another example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure, including aspects defined in the claims. In addition, the term "example" as used throughout this application is only by way of illustration, and not limitation.

Aspects of the present disclosure are believed to be applicable to a variety of different types of apparatuses, systems and methods involving IC packages with an IC die coupled to a leadframe, such as for smartcard applications. While not necessarily so limited, various aspects may be appreciated through a discussion of examples using this context.

Various example embodiments are directed to integrated circuit packages that employ a stainless steel leadframe and a polymer-based material that adheres to both stainless steel in the leadframe and an encapsulation material of the package. An adhesive adheres an IC die to the polymer-based material (and therein to the leadframe), and a conductor such as a metal wire electrically connects the IC die to the leadframe. The encapsulation material, such as an epoxy material mold compound or glob-top epoxy, encapsulates the IC die and the conductor, and also adheres to the polymer-based material. In some implementations, contact between the conductors and stainless steel in the leadframe is made via one or more contact pads on the leadframe, such as silver pads (e.g., pure direct contact between reader pins and the contact pads, via the leadframe). The resulting package exhibits electrical connection to the IC die directly via contact with the stainless steel leadframe and the conductor, facilitating desirable contact for a variety of applications.

In a more specific embodiment, the above-discussed integrated circuit package is implemented with a stainless steel smartcard leadframe, with the stainless steel providing corrosion and scratch resistance while facilitating ease of contact for communicating with the IC die. In connection with one or more such embodiments, it has been discovered that a polymer-based material can be used to adhere both to stainless steel and an IC die encapsulation material, that the combination can provide sufficient strength and flexibility at relatively low thickness (e.g., less than 100 microns), and further that electrical connection to the IC die can be provided via the stainless steel leadframe. Various embodiments are directed to such unexpected results, with regard to direct connection between stainless steel and a polymer that adheres to both the stainless steel and die encapsulation/adhesive. Moreover, by facilitating the use of stainless steel as the leadframe and providing electrical connection therewith, the resulting smartcard package exhibits a silver-type finish via the leadframe (e.g., and without requiring further plating/finishing to achieve such a finish). Such embodiments may, for example, be implemented with various smartcard package-on-smartcard applications, presenting desired strength, reliability, corrosion protection, appearance and size (thin packages), along with electrical connectivity that permit a reader to read data from the IC die via direct contact to the leadframe. Such smartcard applications may involve, for example, banking cards, transaction cards, or identification cards such as driving license cards, health insurance cards and personal ID cards, coupled to the package by laminating the packages with a reel-to-reel hotmelt adhesive and punching the packages out onto a body of the smartcard.

The polymer-based material, as described herein and used to adhere to both stainless steel and encapsulation material, is implemented using one or more of a variety of materials, to suit particular applications. In some embodiments, the polymer material includes one or more of PI (Polyimide), PET (Polyethylene Terephtalate), PEN (Polyethylene naphthalate), or modifications thereof. The polymer-based material thus adheres stainless steel with both the encapsulation material and the die adhesive, and also adheres to additional adhesive (e.g., hotmelt adhesive) that is used to couple the IC package to a smartcard. In some embodiments, the polymer-based material protects the leadframe from contamination, such as may be caused by flow of hotmelt adhesive used to attach the package onto a card body.

Accordingly, various embodiments are directed to a stainless steel leadframe having polymer adhered thereto, in which the polymer-based material is operable to adhere to the stainless steel, die encapsulation and die adhesive. Other embodiments are directed to an entire such IC die package. Yet other embodiments are directed to a smartcard having the IC die package attached, such as via adhesion between the polymer-based material and the smartcard. For general information regarding smartcard packages or modules, and for specific information regarding such aspects as may be implemented with one or more example embodiments, reference may be made to standards published by the International Organization for Standardization (ISO) and by the International Electrotechnical Commission (IEC), including ISO/IEC 10373, ISO/IEC 7810, ISO/IEC 7816, and ISO/IEC24789; further reference may be made to the MasterCard Card Quality Management: Infrastructure quality requirements version 1.9D, all of which are fully incorporated herein by reference.

Figure 1:
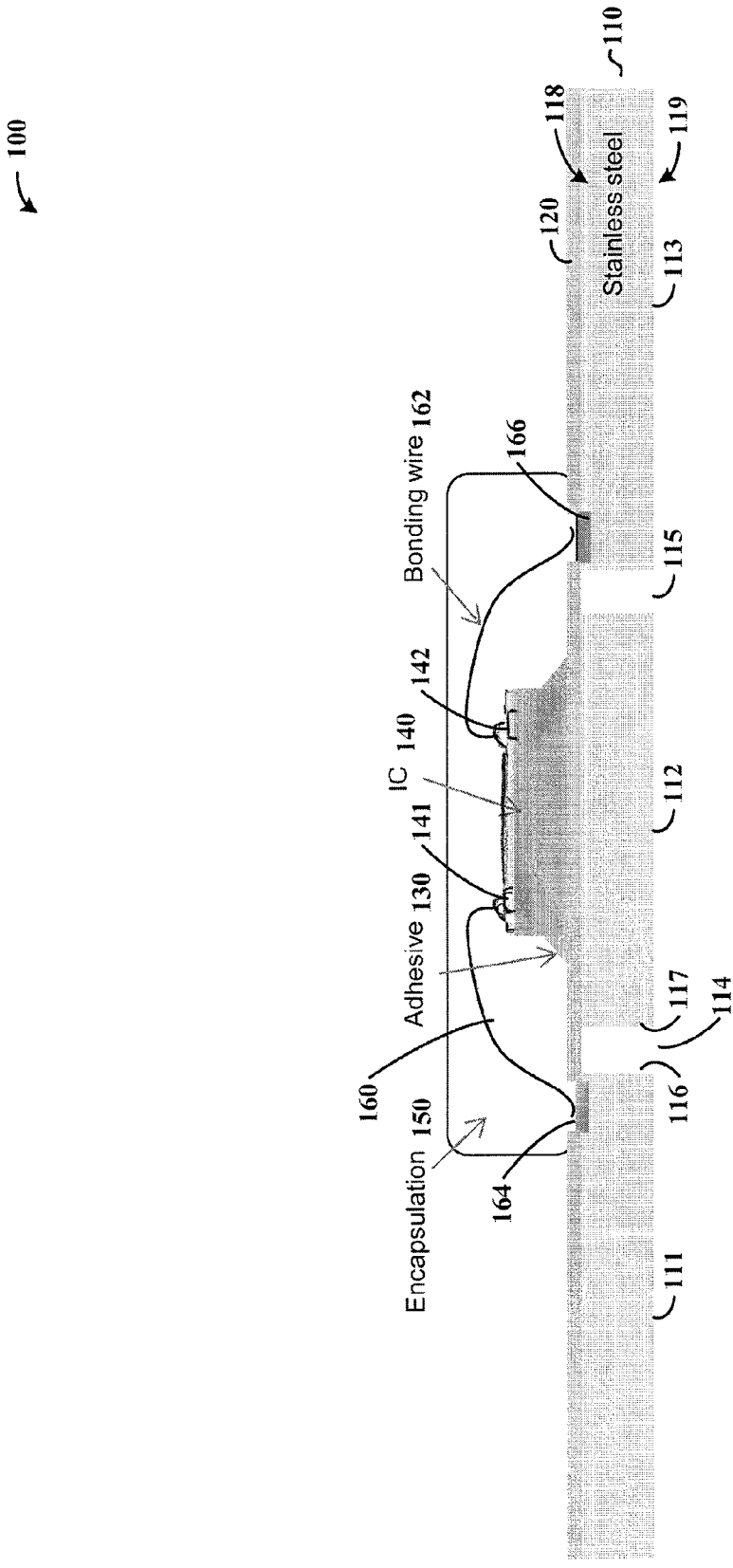
FIG. 1 shows an IC package, in accordance with an example embodiment.

Turning now to the figures, FIG. 1 shows a cross-sectional type view of an IC package apparatus 100, in accordance with another example embodiment. The apparatus 100 includes a stainless steel leadframe 110 having first, second and third portions 111, 112 and 113 separated by openings 114 and 115. In some embodiments, only one such opening is used to separate the first and third portions 111 and 113 (e.g., with second portion 112 being a contiguous part of the first or third portion). The opening(s) electrically isolate the respective portions 111 and 113 of the leadframe 110 from one another, facilitating the communication of data through each of respective portions. Referring to opening 114 by way of example, sidewalls 116 and 117 are defined by the leadframe 110.

A first polymer material 120 is on a first surface of the stainless steel leadframe 110, and a second adhesive material 130 adheres an integrated circuit (IC) die 140 to the first material by adhering to both the integrated circuit die and the first material. The polymer material 120 mitigates and/or prevents passage of material in to the openings, such as the encapsulation material 150 or hotmelt material used to secure the apparatus in further processing, and can further serve to seal the openings for processing (e.g., vacuum).

The polymer material 120 includes one or more of polyimide, polyethylene terephthalate and polyethylene naphthalate, to suit particular embodiments. Example polymer-based materials that may be implemented with the polymer material 120 (e.g., a modified polyimide material) are available from Mectec of Malmö, Sweeden. In some embodiments, the look/color for different structures of the leadframe is set using the type of polymer and different polymer film formats (e.g., no color, yellow, orange or black, and transparent or opaque). The adhesive material may, for example, include a dispensable adhesive, epoxy, die attach film (DAF) adhesive, or wafer backside coated (WBC) adhesive.

A third encapsulation material 150 encapsulates at least a portion of the IC die 140 as well as other components (e.g., wire connectors) discussed below. The polymer material 120 adheres to the encapsulation material as well, securing the IC die relative to the leadframe 110. Example encapsulation materials that may be used in accordance with these and other embodiments include the epoxy mold compound KMC184-8 and KMC-2285 available from Shin-Etsu Chemical Company of Tokyo, Japan, glob-top epoxy such as DF698 or KB4670 from Delo Industrial Adhesives of Windach, Germany, and glob-top epoxy such as Vitralit® 1671 and Vitralit® 1680 available from Panacol-Elosol GmbH of Steinbach, Germany.

The apparatus 100 also includes a first conductor 160 (e.g., bond wire) connected between a first contact 141 of the IC die 140 and the first portion 111 of the leadframe 110 via an opening in the polymer material 120, and a second conductor 162 connected between a second contact 142 of the IC die and the third portion 113 of the leadframe, via a second opening in the polymer material. In some implementations, the apparatus 100 includes conductive contacts 164 and 166 on the leadframe, which facilitate connection to the first and second conductors 160 and 162. Further, while two connections are shown between the IC die 140 and respective leadframe portions 111 and 113, multiple such connections are made to suit particular applications, with additional contacts, connectors and other respective components as shown to facilitate such connections. The first conductor 160 and the IC die 140 pass a signal between the first contact 141 and the first portion of the leadframe 111, and the second conductor 162 and the IC die pass a signal between the second contact 142 and the third portion of the leadframe 113.

In various embodiments, the polymer material 120 operates to secure the respective portions of the stainless steel leadframe 110 relative to one another. This approach can be implemented during manufacturing to maintain spacing between the leadframe portions 111, 112 and 113. This maintains electrical isolation during manufacturing and until the leadframe 110 is coupled further (e.g., to a smartcard as shown in FIG. 6, with an additional adhesive).

Figure 2:
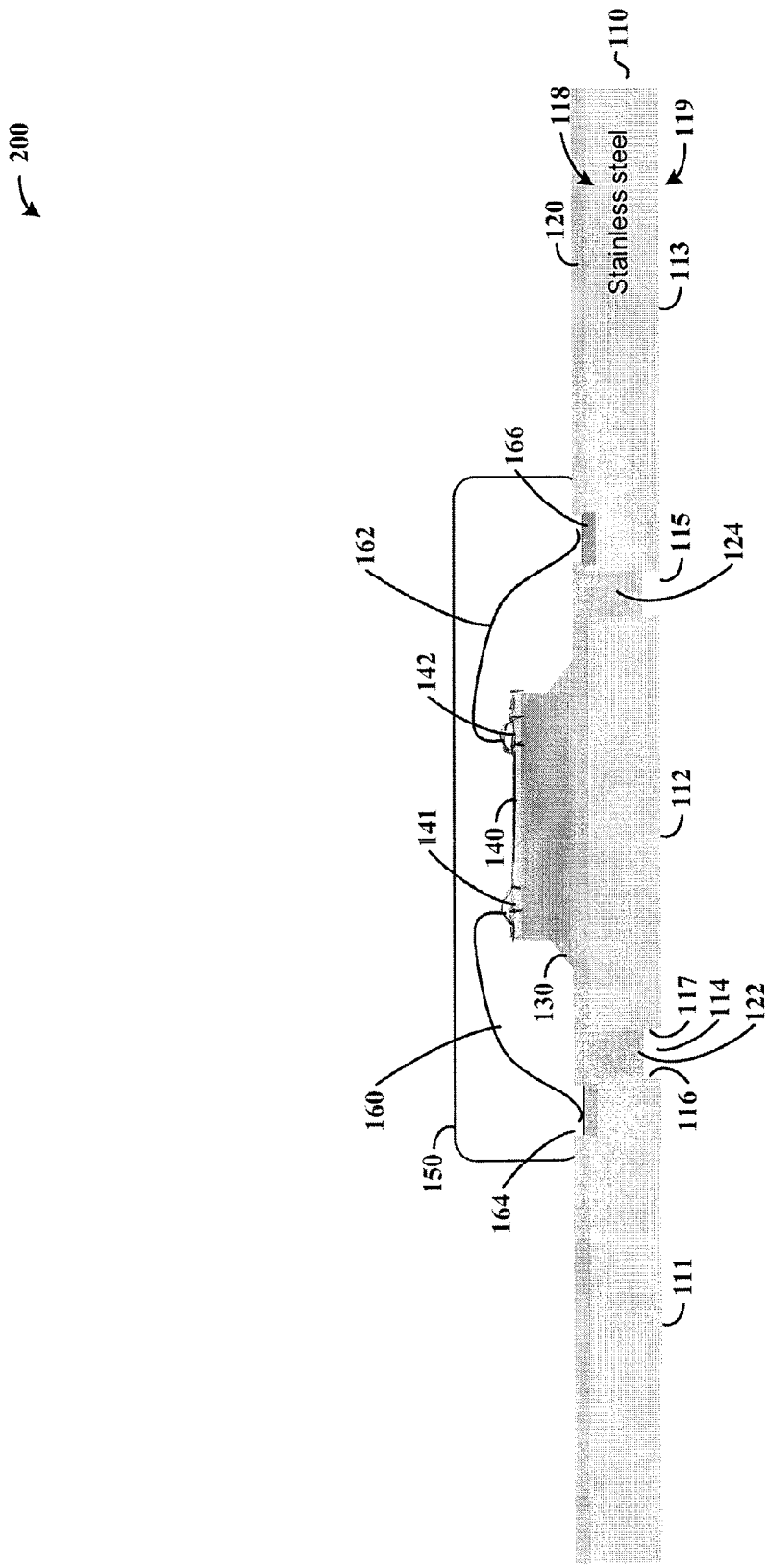
FIG. 2 shows an IC package, in accordance with another example embodiment.

FIG. 2 shows another cross-sectional type view of an IC package apparatus 200, in accordance with another example embodiment. The apparatus 200 is similar to the apparatus 100 shown in FIG. 1, and thus shares similar reference numbers for similar components, with the above discussion apply. The apparatus 200 also includes respective portions 122 and 124 of the first polymer-based material 120 in each of the respective openings 114 and 115. These portions 122 and 124 mitigate or prevent passage of material into the openings, such as the encapsulation material 150 or hotmelt material used to secure the apparatus in further processing. In some implementations, the portions 122 and 124 fill the openings to facilitate vacuum-coupling of the apparatus 100 during assembly.

In various embodiments as may be implemented with FIG. 1 and/or FIG. 2, the first 111 and second 112 portions of the leadframe 110 each include a contiguous region of stainless steel that conduct signals between the first surface 118 of the leadframe and a second surface 119 of the leadframe, which is opposite the first surface. Each of the first 111 and second 112 portions of the leadframe operate with the IC die to provide access to data in the IC die, via the second surface 119 of the leadframe (e.g., via contact to be made with an external reader upon insertion of a smart card including the IC package apparatus).

FIG. 3A-3E show a cross-section type view of a leadframe apparatus 300 at various stages of manufacture in accordance with one or more embodiments. Beginning with FIG. 3A, a stainless steel leadframe base 310 is provided, and the leadframe is separated into respective portions 311, 312 and 313 via openings 314 and 315 therein as shown in FIG. 3B. Additional such openings/separation may be made to facilitate additional contact regions via the leadframe. FIG. 3C shows the apparatus 300 with plated contacts 316 and 317 thereupon, which can be implemented with one or more of a variety of conductive materials such as silver.

After separation of the leadframe 110 via the openings, a polymer-type layer is applied to seal the openings and provide structural support to the leadframe, maintaining the separation provided via the openings. FIG. 3D shows a first such implementation in which the apparatus 300 is coated with a polymer-based coating 320 that adheres to the leadframe and package encapsulation material. In some implementations, the polymer-based coating 320 is applied via lamination, such as in a reel-to-reel process with multiple such apparatuses 300 formed in a reel (e.g., as shown in FIG. 5).

FIG. 3E shows a second such implementation in which the apparatus has a polymer-based coating 322 that adheres to the leadframe and package encapsulation material, and includes portions 323 and 324 that fill a portion of openings in the leadframe. In some implementations, the polymer-based coating 322 is applied via screen printing, such as in a reel-to-reel process with multiple such apparatuses 300 formed in a reel (e.g., as shown in FIG. 5).

With regard to both FIGS. 3E and 3D, various embodiments are further directed to using such approaches to provide a package as shown in FIGS. 1 and 2, respectively. The adhesive 130 is applied to the polymer (320 or 322), the IC die 140 is applied to the adhesive, conductors 160 and 162 are coupled to the plated contacts 316 and 317 (or more), and encapsulation material 150 is applied over the IC die, conductors and contacts as shown.

FIGS. 4A-4D show an IC package apparatus 400 at various stages of manufacture, in accordance with one or more embodiments. The apparatus 400 may be implemented using one of the sandwiched leadframe/polymer packages as shown in FIGS. 3D and 3E. Beginning with FIG. 4A, adhesive material 430 is applied to a leadframe 410 having isolated portions 411 and 412 and a polymer-based coating 420, such as shown in FIG. 3D. In FIG. 4B, an IC die 440 is adhered to the leadframe/polymer by the adhesive material 430. The IC die 440 includes multiple contacts, which are coupled via wire bonds 460 and 462 as shown in FIG. 4C by way of example, with additional such wire bonds used to suit particular embodiments. In FIG. 4D, an encapsulation 450 has been applied over the IC die and wire bonds. The polymer-based coating 420 adheres to the leadframe 410, adhesive 430, and encapsulation 450.

FIG. 5 shows a plurality of IC package apparatuses in a reel 500 implemented in a reel-to-reel manufacturing process, in accordance with another example embodiment. The IC package apparatuses include apparatuses 510 and 512 shown by way of example, which may be implemented using one or more approaches as shown in FIGS. 1-4D. The package apparatuses are formed on a supporting structure 520, for reel implementation. This approach is used in an electronic-package assembly processes in which the structure 520 supports the respective apparatuses during IC attachment, electrical interconnection, encapsulation and device testing.

The resulting apparatuses can then be separated from the others and from the supporting structure 520 for application, such as shown in FIG. 6. Accordingly, FIG. 6 shows a smartcard apparatus 600 having an IC package 610, in accordance with another example embodiment. The IC package 610 may, for example, include a package such as shown in FIG. 1 or in FIG. 2, and implemented as described in other figures and embodiments. The apparatus 600 also includes a card substrate 620 having first and second planar surfaces (e.g., with a first upper surface shown and a second lower surface below, separated by the thickness of the card substrate). The upper surface has a recess 622 that is sized to accept the IC package 610, which can be adhered thereto with an adhesive. The IC package 610 is operable to mitigate or prevent the adhesive from contacting and contaminating a leadframe contact, such as by sealing openings with a polymer as discussed above. Accordingly, the polymer adheres to stainless steel in the leadframe, to adhesive material that holds an IC die to the leadframe, to encapsulation material that encapsulates the IC die, and to the adhesive material that secures the IC package to the card substrate 620. The resulting apparatus has the IC package 610 with respective leadframe portions operating as external electrical contacts for reader communication.

The circuitry, modules, packages and functions discussed herein may be implemented using one or more of a variety of circuits. For instance, discrete logic circuits or programmable logic circuits may be configured and arranged for implementing operations/activities, as shown in the Figures and described above and as may be related to SIM (subscriber identity module) cards, smartcards, and other applications. In certain embodiments, a programmable circuit includes one or more computer type circuits programmed to execute a set (or sets) of instructions (and/or configuration data). The instructions (and/or configuration data) can be in the form of firmware or software stored in and accessible from a memory (circuit). As an example, first and second modules may include a combination of a CPU hardware-based circuit and a set of instructions in the form of firmware, where the first module includes a first CPU hardware circuit with one set of instructions and the second module includes a second CPU hardware circuit with another set of instructions. Such circuits may, for example, communicate data for authentication and/or operation.

Based upon the above discussion and illustrations, those skilled in the art will readily recognize that various modifications and changes may be made to the various embodiments without strictly following the exemplary embodiments and applications illustrated and described herein. For example, various types of polymers that adhere to both stainless steel and encapsulating material may be used as discussed herein. Additional contacts may be made between the IC dies as described and an underlying leadframe, with additional leadframe portions formed and electrically isolated as discussed. Further, various embodiments are directed to IC package integration with smartcards as discussed herein, or other applications such as SIM cards. Such modifications do not depart from the true spirit and scope of various aspects of the invention, including aspects set forth in the claims.

What is claimed is:

1. An apparatus comprising:
   an integrated circuit (IC) die having first and second contacts;
   a stainless steel leadframe having first and second portions separated by at least one opening having sidewalls defined by the leadframe, the at least one opening electrically insulating the first and second portions from one another;
   a first material on a first surface of the stainless steel leadframe and configured and arranged to adhere to the leadframe;
   a second material configured and arranged to adhere the IC die to the first material by adhering to both the IC die and the first material;
   a third material configured and arranged to encapsulate at least a portion of the IC die, the first and third material being configured and arranged to adhere to one another and secure the IC die relative to the leadframe;
   a first conductor connected between the first contact and the first portion of the leadframe via a first opening in the first material, the first conductor and the IC die being configured and arranged to pass a signal between the first contact and the first portion of the leadframe; and
   a second conductor connected between the second contact and the second portion of the leadframe, via a second opening in the first material, the second conductor and the IC die being configured and arranged to pass a signal between the second contact and the second portion of the leadframe.

2. The apparatus of claim 1, wherein
   the first and second portions of the leadframe are electrically isolated from one another by the openings, and respectively include contiguous regions of stainless steel within each portion and configured and arranged to conduct the signals between the first surface of the leadframe and a second surface of the leadframe that is opposite the first surface, and
   the first and second portions of the leadframe are configured and arranged with the IC die to provide access to data in the IC die, via the second surface of the leadframe.

3. The apparatus of claim 1, wherein the first material is configured and arranged to mitigate passage of the third material into the at least one opening.

4. The apparatus of claim 3, wherein the first material fills and seals at least a portion of the at least one opening.

5. The apparatus of claim 1, further including
   a third contact on the first surface at the first portion of the leadframe and being connected to the first conductor, the third contact being configured and arranged to pass a signal between the first conductor and the first portion of the leadframe, and
   a fourth contact on the first surface at the second portion of the leadframe and being connected to the second conductor, the fourth contact being configured and arranged to pass a signal between the second conductor and the second portion of the leadframe.

6. The apparatus of claim 1, wherein
   the at least one opening includes first and second openings in the leadframe, the first opening in the leadframe being defined by sidewalls of the first portion of the leadframe and of a third portion of the leadframe that is between the first and second portions of the leadframe, and the second opening in the leadframe being defined by sidewalls of the second and third portions of the leadframe, and
   the first material fills at least a portion of each of the first and second openings in the leadframe, and is configured and arranged to prevent material from passing into the first and second openings in the leadframe.

7. The apparatus of claim 1, wherein the third material encapsulates the IC die and the first and second conductors.

8. The apparatus of claim 1, wherein the first material includes a polymer having at least one of: polyimide, polyethylene terephthalate and polyethylene naphthalate.

9. The apparatus of claim 1,
   wherein the first material includes a polymer configured and arranged to adhere to the stainless steel in the leadframe, to the second material, to the third material, and to a fourth adhesive material, and
   further including the fourth adhesive material and a smartcard having a recessed region configured and arranged to accept the IC die and leadframe package and being adhered to the IC die and leadframe package via adhesion between the fourth adhesive material and the first material.

10. The apparatus of claim 1, wherein the first material is configured and arranged to secure the first and second portions of the stainless steel leadframe relative to one another, and maintain spacing between the first and second portions in the openings.

11. A smartcard apparatus comprising:
a card substrate having first and second planar surfaces, the first surface having a recessed region extending into the card substrate toward the second planer surface;
an integrated circuit (IC) die having first and second contacts;
a stainless steel leadframe having first and second portions separated by at least one opening having sidewalls defined by the leadframe, the at least one opening electrically insulating the first and second portions from one another;
a first material on a first surface of the stainless steel leadframe and configured and arranged to adhere to the leadframe and to maintain spacing between the first and second portions securing the first and second portions of the stainless steel leadframe relative to one another;
a second material configured and arranged to adhere the IC die to the first material by adhering to both the IC die and the first material;
a first conductor connected between the first contact and the first portion of the leadframe via a first opening in the first material, the first conductor and the IC die being configured and arranged to pass a signal between the first contact and the first portion of the leadframe;
a second conductor connected between the second contact and the second portion of the leadframe via a second opening in the first material, the second conductor and the IC die being configured and arranged to pass a signal between the second contact and the second portion of the leadframe;
a third material configured and arranged to encapsulate the IC die and the first and second conductors, the first and third material being configured and arranged to adhere to one another and secure the IC die relative to the leadframe to form an IC package; and
a fourth adhesive material configured and arranged to secure the IC package to the card substrate in the recessed region of the first surface with the leadframe being coplanar with the first surface, by adhering to the first material.

12. A method comprising:
separating and electrically isolating first and second portions of a stainless steel leadframe by forming at least one opening in the leadframe, the opening having sidewalls defined by the leadframe;
forming a first material on a first surface of the stainless steel leadframe, the first material adhering to the leadframe;
adhering an integrated circuit (IC) die having first and second contacts to the first material by forming a second material on the first material and using the second material to adhere to both the first material and the IC die;
connecting a first conductor between the first contact and the first portion of the leadframe via a first opening in the first material, the first conductor providing an electrical connection that passes a signal between the first contact and the first portion of the leadframe;
connecting a second conductor between the second contact and the second portion of the leadframe via a second opening in the first material, the second conductor providing an electrical connection that passes a signal between the second contact and the second portion of the leadframe; and
encapsulating at least a portion of the IC die with a third material, and using the first and third material to adhere to one another and secure the IC die relative to the leadframe.

13. The method of claim 12, further including adhering the leadframe to a recessed region of a surface of a card substrate with a fourth material, the leadframe being coplanar with the first surface and being exposed to provide electrical connection to the first and second conductors.

14. The method of claim 12, further including using the first material to
secure the first and second portions of the stainless steel leadframe relative to one another, and
maintain spacing between the first and second portions in the openings.

15. The method of claim 12, further including applying a vacuum to a second surface of the leadframe that is opposite the first surface to secure the leadframe while adhering the IC die thereto, using the first material to seal the openings and facilitate vacuum coupling to the second surface.

16. The method of claim 12, wherein encapsulating at least a portion of the IC die includes using the first material to mitigate passage of the third material into the at least one opening.

17. The method of claim 16, wherein forming the first material includes filling and sealing at least a portion of the at least one opening.

18. The method of claim 12, further including forming third and fourth contacts on the leadframe, and respectively connecting the first and second conductors to the third and fourth contacts via openings in the first material.

19. The method of claim 12, further including
separating and electrically isolating a plurality of additional portions of the leadframe, the additional portions including a third portion to which the IC die is adhered via the second material, and
forming a plurality of additional conductors between additional contacts of the IC die and respective ones of the additional portions of the leadframe.

20. The method of claim 12, wherein forming the first material includes forming a polymer having at least one of: polyimide, polyethylene terephthalate and polyethylene naphthalate.

* * * * *